(12) United States Patent
Nakamura et al.

(10) Patent No.: US 12,334,899 B2
(45) Date of Patent: Jun. 17, 2025

(54) ACOUSTIC WAVE DEVICES ON STACKED DIE

(71) Applicant: Skyworks Solutions, Inc., Irvine, CA (US)

(72) Inventors: Hiroyuki Nakamura, Osaka-Fu (JP); Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 125 days.

(21) Appl. No.: 18/174,068

(22) Filed: Feb. 24, 2023

(65) Prior Publication Data

US 2023/0283255 A1 Sep. 7, 2023

Related U.S. Application Data

(63) Continuation of application No. 16/381,576, filed on Apr. 11, 2019, now Pat. No. 11,616,487.
(Continued)

(51) Int. Cl.
*H03H 9/02* (2006.01)
*H03F 3/24* (2006.01)
(Continued)

(52) U.S. Cl.
CPC ............ *H03H 9/0222* (2013.01); *H03F 3/24* (2013.01); *H03H 9/02559* (2013.01);
(Continued)

(58) Field of Classification Search
CPC .............. H03H 9/0222; H03H 9/02559; H03H 9/02574; H03H 9/02834; H03H 9/02866;
(Continued)

(56) References Cited

U.S. PATENT DOCUMENTS 6,445,265 B1 9/2002 Wright
7,322,093 B2 1/2008 Kadota et al.
(Continued)

FOREIGN PATENT DOCUMENTS

EP 2658123 A1 10/2013
JP H0595249 A 4/1993
(Continued)

OTHER PUBLICATIONS

Aslam et. al., "Surface acoustic wave modes characteristics of CMOS compatible SiO2/AlN/SiO2/Si multilayer structure with embedded electrodes", Sensors and Actuators A: Physical vol. 313, Oct. 1, 2020, 112202 (Year: 2020).*
(Continued)

*Primary Examiner* — Hafizur Rahman
(74) *Attorney, Agent, or Firm* — Knobbe, Martens, Olson & Bear, LLP

(57) ABSTRACT

Aspects of this disclosure relate to acoustic wave devices on stacked die. A first die can include first acoustic wave device configured to generate a boundary acoustic wave. A second die can include a second acoustic wave device configured to generate a second boundary acoustic wave, in which the second die is stacked with the first die. The first acoustic wave resonator can include a piezoelectric layer, an interdigital transducer electrode on the piezoelectric layer, and high acoustic velocity layers on opposing sides of the piezoelectric layer. The high acoustic velocity layers can each have an acoustic velocity that is greater than a velocity of the boundary acoustic wave.

20 Claims, 15 Drawing Sheets

Related U.S. Application Data

(60) Provisional application No. 62/659,568, filed on Apr. 18, 2018.

(51) Int. Cl.

| | | |
|---|---|---|
| *H03H 9/05* | (2006.01) | |
| *H03H 9/145* | (2006.01) | |
| *H03H 9/25* | (2006.01) | |
| *H03H 9/46* | (2006.01) | |
| *H03H 9/54* | (2006.01) | |
| *H03H 9/64* | (2006.01) | |
| *H04B 1/00* | (2006.01) | |

(52) U.S. Cl.
CPC .... *H03H 9/02574* (2013.01); *H03H 9/02834* (2013.01); *H03H 9/02866* (2013.01); *H03H 9/058* (2013.01); *H03H 9/145* (2013.01); *H03H 9/25* (2013.01); *H03H 9/465* (2013.01); *H03H 9/54* (2013.01); *H03H 9/64* (2013.01); *H03H 9/6489* (2013.01); *H04B 1/0057* (2013.01); *H03F 2200/451* (2013.01)

(58) Field of Classification Search
CPC .......... H03H 9/058; H03H 9/145; H03H 9/25; H03H 9/465; H03H 9/54; H03H 9/64; H03H 9/6489; H03F 3/24; H03F 2200/451; H04B 1/0057
USPC ...................................................... 310/313 R
See application file for complete search history.

(56) References Cited

U.S. PATENT DOCUMENTS

| | | | |
|---|---|---|---|
| 7,471,027 B2 | 12/2008 | Kando | |
| 7,550,898 B2 | 6/2009 | Kadota et al. | |
| 7,733,198 B1 | 6/2010 | Olsson et al. | |
| 7,898,145 B2 | 3/2011 | Mimura et al. | |
| 7,902,717 B2 | 3/2011 | Saijou et al. | |
| 11,616,487 B2 | 3/2023 | Nakamura et al. | |
| 11,689,178 B2 | 6/2023 | Nakamura et al. | |
| 2005/0057323 A1 | 3/2005 | Kando et al. | |
| 2006/0138902 A1 | 6/2006 | Kando | |
| 2008/0169574 A1* | 7/2008 | Molkkari ................ H01L 24/81 257/E21.503 |
| 2009/0115287 A1 | 5/2009 | Kando | |
| 2011/0109196 A1 | 5/2011 | Goto et al. | |
| 2011/0266917 A1 | 11/2011 | Metzger et al. | |
| 2012/0025931 A1 | 2/2012 | Yamamoto et al. | |
| 2013/0026881 A1 | 1/2013 | Okamoto et al. | |
| 2013/0285768 A1 | 10/2013 | Watanabe et al. | |
| 2014/0203893 A1 | 7/2014 | Kando et al. | |
| 2014/0217566 A1* | 8/2014 | Goida ..................... H01L 23/04 257/676 |
| 2015/0102705 A1* | 4/2015 | Iwamoto ............ H03H 9/02574 310/313 B |
| 2016/0044677 A1 | 2/2016 | King et al. | |
| 2017/0141752 A1 | 5/2017 | Hino | |
| 2017/0250674 A1 | 8/2017 | Takamine et al. | |
| 2019/0097606 A1 | 3/2019 | Nosaka et al. | |
| 2019/0326874 A1 | 10/2019 | Nakamura et al. | |
| 2019/0326875 A1 | 10/2019 | Nakamura et al. | |
| 2019/0326879 A1 | 10/2019 | Nakamura et al. | |

FOREIGN PATENT DOCUMENTS

| | | |
|---|---|---|
| JP | 3710445 B2 | 10/2005 |
| JP | 2011-066492 | 3/2011 |
| JP | 2015-146333 | 8/2015 |
| JP | 2017-528060 | 9/2017 |
| KR | 10-2013-0086378 | 8/2013 |
| TW | 2010-21409 | 6/2010 |
| WO | WO 98/52279 | 11/1998 |
| WO | WO 2010/004741 | 1/2010 |
| WO | WO 2011/046117 | 4/2011 |
| WO | WO 2011/158445 | 12/2011 |
| WO | WO 2012/086639 | 6/2012 |
| WO | WO 2017/043427 | 3/2017 |
| WO | WO 2017/068828 | 4/2017 |
| WO | WO 2017/138540 | 8/2017 |

OTHER PUBLICATIONS

Drafts, B. "Acoustic Wave Technology Sensors", Fierce Electronics, Oct. 1, 2000, in 10 pages.
Kadota, Michio et al., "RF Filter using Boundary Acoustic Wave," Japanese Journal of Applied Physics, vol. 45, No. 5B, May 25, 2006, pp. 4651-4654.
Kando, Hajime, et al., "RF Filter using Boundary Acoustic Wave," 2006 IEEE Ultrasonics Symposium, pp. 188-191.
Irino, Toshio, et al., "Propagation of Boundary Acoustic Waves along a ZnO Layer between Two Materials," IEEE Ultrasonics Symposium, 1986, pp. 195-200.
Pitschi, F.M., et al., "Approaches to Wafer Level Packaging for SAW Components", IEEE, 2013, in 3 pages.
Yamane, Takashi, et al., "A Miniaturized UMTS Band II Duplexer Employing Piezoelectric Boundary Acoustic Wave," Proceedings of the Asia-Pacific Microwave Conference 2011, pp. 550-553.
Wang, Yiliu, et al., "Change in Piezoelectric Boundary Acoustic Wave Characteristics with Overlay and Metal Grating Materials," Conference Paper, Apr. 2009, pp. 241-244.

* cited by examiner

ACOUSTIC WAVE DEVICES ON STACKED DIE

CROSS REFERENCE TO PRIORITY APPLICATIONS

This application is a continuation of U.S. patent application Ser. No. 16/381,576, filed Apr. 11, 2019 and titled "ACOUSTIC WAVE DEVICES ON STACKED DIE," which claims the benefit of priority under 35 U.S.C. § 119(e) of U.S. Provisional Patent Application No. 62/659,568, filed Apr. 18, 2018 and titled "ACOUSTIC WAVE DEVICE WITH MULTI-LAYER PIEZOELECTRIC SUBSTRATE," the disclosures of each of which are hereby incorporated by reference in their entireties herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. A plurality of acoustic wave filters coupled to a common node can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transducer electrode is disposed. A surface acoustic wave device can include a cavity on the surface of a chip on which a surface acoustic wave propagates.

A boundary acoustic wave resonator can concentrate acoustic energy near a boundary of two attached materials of the boundary acoustic wave device. Boundary acoustic wave resonators can be implemented without a cavity over the surface of a chip that generates a boundary acoustic wave.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device that includes a piezoelectric layer, an interdigital transducer electrode on the piezoelectric layer, high velocity layers on opposing sides of the piezoelectric layer, and a low velocity layer positioned between the piezoelectric layer and a first high velocity layer of the high velocity layers. The low velocity layer has a lower acoustic velocity than the high velocity layers. The acoustic velocity is the speed of sound of a shear wave propagating in a solid. The acoustic wave device is configured to generate a boundary acoustic wave such that acoustic energy is concentrated at a boundary of the piezoelectric layer and the low velocity layer.

Each of the high velocity layers can have a higher acoustic velocity than a velocity of the boundary acoustic wave. The velocity of the boundary acoustic wave can be in a range from 2500 meters per second to 4800 meters per second. The velocity of the boundary acoustic wave can be in a range from 4100 meters per second to 4800 meters per second.

The low velocity layer can include silicon dioxide. The high velocity layers can be silicon layers.

At least one of the high velocity layers can be a silicon layer. At least one of the high velocity layers can include at least one of silicon nitride, aluminum nitride, diamond, quartz, or spinel. The high velocity layers can be made of the same material as each other.

The boundary acoustic wave has a wavelength of k. With a thickness of at least 1λ, the boundary acoustic wave can be confined at the boundary of the piezoelectric layer and the low velocity layer. At least one of the high velocity layers can have a thickness in a range from 1λ to 10λ. At least one of the high velocity layers can have a thickness in a range from 1λ to 5λ. In some instances, one or both of the high velocity layers can have a thickness of greater than 10λ. The piezoelectric layer can have a thickness of less than 2λ. The piezoelectric layer can be a lithium tantalate layer. The piezoelectric layer can be a lithium niobate layer.

Another aspect of this disclosure is a radio frequency module that includes an acoustic wave filter configured to filter a radio frequency signal and a radio frequency switch coupled to the acoustic wave filter. The radio frequency switch is packaged with the acoustic wave filter. The acoustic wave filter includes an acoustic wave device including a piezoelectric layer, an interdigital transducer electrode on the piezoelectric layer, high velocity layers on opposing sides of the piezoelectric layer, and a low velocity layer disposed between the piezoelectric layer and a first high velocity layer of the high velocity layers. The low velocity layer has a lower acoustic velocity than the high velocity layers. The acoustic wave device is configured to generate a boundary acoustic wave such that acoustic energy is concentrated at a boundary of the piezoelectric layer and the low velocity layer.

The radio frequency module can include a power amplifier, in which the radio frequency switch is configured to selectively electrically connect an output of the power amplifier to the acoustic wave filter. The radio frequency module can include an antenna port, in which the radio frequency switch is configured to selectively electrically connect the acoustic wave filter to an antenna port of the radio frequency module.

Another aspect of this disclosure is a method of filtering a radio frequency signal with an acoustic wave filter. The method includes providing a radio frequency signal to an acoustic wave filter and filtering the radio frequency signal with the acoustic wave filter. The acoustic wave filter includes an acoustic wave device that includes a piezoelectric layer, an interdigital transducer electrode on the piezoelectric layer, high velocity layers on opposing sides of the piezoelectric layer, a low velocity layer positioned between the piezoelectric layer and a first high velocity layer of the high velocity layers. The low velocity layer having a lower acoustic velocity than the high velocity layers. The acoustic wave device generating a boundary acoustic wave such that acoustic energy is concentrated at a boundary of the piezoelectric layer and the low velocity layer.

The high velocity layers can be silicon layers and the low velocity layer can be a silicon dioxide layer. The piezoelectric layer can be a lithium niobate layer or a lithium tantalate layer.

Another aspect of this disclosure is an acoustic wave device that includes a piezoelectric layer, an interdigital transducer electrode on the piezoelectric layer, high velocity layers on opposing side of the piezoelectric layer, and a temperature compensation layer positioned between the first high velocity layer and the piezoelectric layer. The high velocity layers include a first high velocity layer having a first acoustic velocity and a second high velocity layer having a second acoustic velocity. The acoustic wave device is configured to generate a boundary acoustic wave having a velocity that is less than both the first acoustic velocity and the second acoustic velocity.

The first acoustic velocity can be substantially the same as the second acoustic velocity. The first acoustic velocity can be different than the second acoustic velocity.

The first high velocity layer can be a silicon layer. The second high velocity layer can be a second silicon layer. The first high velocity layer can include at least one of silicon nitride, aluminum nitride, diamond, quartz, or spinel. The piezoelectric layer can be either a lithium tantalate layer or a lithium niobate layer. The temperature compensation layer can include silicon dioxide.

The boundary acoustic wave has a wavelength of $\lambda$. The first high velocity layer can have a thickness in a range from $1\lambda$, to $10\lambda$. The piezoelectric layer can have a thickness of less than $2\lambda$.

The interdigital transducer electrode is can be contact with the piezoelectric layer on a side of the piezoelectric layer facing the temperature compensation layer. The interdigital transducer electrode can be in contact with the piezoelectric layer on a side of the piezoelectric layer that is opposite to the temperature compensation layer.

Another aspect of this disclosure is an acoustic wave device that includes a piezoelectric layer, an interdigital transducer electrode on the piezoelectric layer, silicon layers on opposing sides of the piezoelectric layer, and a silicon dioxide layer disposed between one of the silicon layers and the piezoelectric layer. The acoustic wave device is configured to generate a boundary acoustic wave at an interface of the piezoelectric layer and the interdigital transducer electrode.

The boundary acoustic wave has a wavelength of $\lambda$. The silicon layers can each have a thickness in a range from $\lambda$ to $10\lambda$. The piezoelectric layer can have a thickness of no greater than $2\lambda$.

The piezoelectric layer can be a lithium tantalate layer. The piezoelectric layer can be a lithium niobate layer.

The interdigital transducer electrode can be on a side of the piezoelectric layer facing the silicon dioxide layer. The interdigital transducer electrode can be on a side of the piezoelectric layer opposite to the silicon dioxide layer.

Another aspect of this disclosure is an acoustic wave filter comprising an acoustic wave device that includes a piezoelectric layer, an interdigital transducer electrode on the piezoelectric layer, silicon layers on opposing sides of the piezoelectric layer, and a silicon dioxide layer disposed between one of the silicon layers and the piezoelectric layer. The acoustic wave device is configured to generate a boundary acoustic wave. The acoustic wave filter is configured to filter a radio frequency signal.

Another aspect of this disclosure is an acoustic wave device assembly that includes a first die and a second die stacked with the first die. The first die includes a first acoustic wave device configured to generate a boundary acoustic wave. The first acoustic wave device includes a piezoelectric layer, an interdigital transducer electrode on the piezoelectric layer, and high acoustic velocity layers on opposing sides of the piezoelectric layer. The high acoustic velocity layers each have an acoustic velocity that is greater than a velocity of the boundary acoustic wave. The second die includes a second acoustic wave device configured to generate a second boundary acoustic wave.

The acoustic wave device assembly can include a third die stacked with the first die and the second die, in which the third die can includes a third acoustic wave device configured to generate a third boundary acoustic wave.

The first acoustic wave device can include a temperature compensation layer disposed between the piezoelectric layer and a first high acoustic velocity layer of the high acoustic velocity layers.

A first high acoustic velocity layer of the high acoustic velocity layers can be a silicon layer. A first high acoustic velocity layer of the high acoustic velocity layers can include at least one of silicon nitride, aluminum nitride, diamond, quartz, or spinel.

The first acoustic wave device can be included in a first acoustic wave filter, and the second acoustic wave device can be included in a second acoustic wave filter.

The acoustic wave device assembly can include a via extending through the first die. The acoustic wave device assembly can include a wire bond extending from the second die.

The first die can be electrically isolated from the second die. The acoustic wave device assembly can include an air gap between the first die and the second die. The acoustic wave device assembly can include a dielectric material disposed between the first die and the second die. The acoustic wave device assembly can include a dielectric material and a metal shield disposed between the first die and the second die.

The second acoustic wave device can include a second piezoelectric layer, a second interdigital transducer electrode on the second piezoelectric layer, and second high acoustic velocity layers on opposing sides of the second piezoelectric substrate, in which the second high acoustic velocity layers each have an acoustic velocity that is greater than a velocity of the second boundary acoustic wave.

Another aspect of this disclosure is a radio frequency module with acoustic wave filters. The radio frequency module includes a first acoustic wave filter configured to filter a first radio frequency signal, a second acoustic wave filter configured to filter a second radio frequency signal, and a package enclosing the first acoustic wave filter and the second acoustic wave filter. The first acoustic wave filter includes a first acoustic wave device on a first die and configured to generate a boundary acoustic wave. The first acoustic wave device includes a piezoelectric layer and high acoustic velocity layers on opposing sides of the piezoelectric layer, in which the high acoustic velocity layers each have an acoustic velocity that is greater than a velocity of the boundary acoustic wave. The second acoustic wave filter including a second acoustic wave device on a second die and configured to generate a second boundary acoustic wave. The second die is stacked with the first die.

A thickness of the radio frequency module can be less than 300 micrometers.

A duplexer can include the first acoustic wave filter and the second acoustic wave filter.

The radio frequency module can include a radio frequency switch coupled to the first acoustic wave filter and the second acoustic wave filter, in which the radio frequency switch being enclosed within the package.

Another aspect of this disclosure is a wireless communication device that includes an antenna and acoustic wave filters in communication with the antenna. The acoustic wave filters are configured to filter radio frequency signals. The acoustic wave filters include a first die stacked with a second die. The first die includes a first acoustic wave device configured to generate a boundary acoustic wave. The first acoustic wave device includes a piezoelectric layer disposed between two high acoustic velocity layers having acoustic velocities that are higher than a velocity of the boundary acoustic wave.

The wireless communication device can include a transceiver in communication with the acoustic wave filters. The wireless communication device can include a radio frequency switch, the acoustic wave filters arranged as a multiplexer that is coupled to the radio frequency switch.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/381,501, titled "ACOUSTIC WAVE DEVICE WITH MULTI-LAYER PIEZOELECTRIC SUBSTRATE," filed on Apr. 11, 2019, the entire disclosure of which is hereby incorporated by reference herein. The present disclosure also relates to U.S. patent application Ser. No. 16/381,567, titled "BOUNDARY ACOUSTIC WAVE DEVICE," filed on Apr. 11, 2019, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
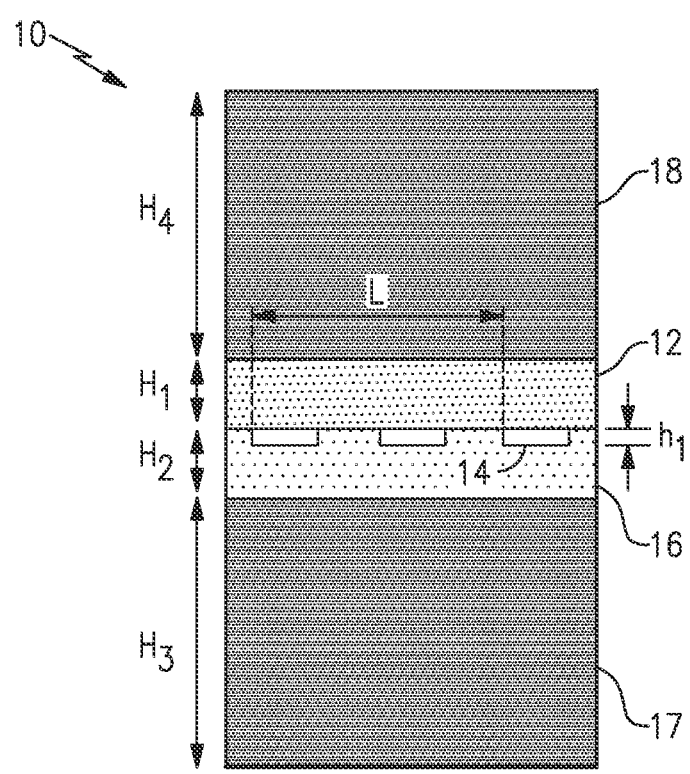
FIG. 1 illustrates a cross sectional view of an acoustic wave device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices can include an air cavity above a surface on which a surface acoustic wave propagates. The air cavity can add to the height and/or volume of SAW device chips. The size of SAW device chips contributes to the overall size of a packaged component.

Boundary acoustic wave devices can be implemented without air cavities. This can reduce package size relative to implementing SAW devices that include an air cavity. However, boundary acoustic wave devices have encountered difficulty in confining acoustic waves within the device. Moreover, implementing relatively thin boundary acoustic wave devices has been challenging.

Aspects of this disclosure relate to a multi-layer piezoelectric device that includes high velocity layers on opposing sides of a piezoelectric layer. The high velocity layers each have an acoustic velocity that is higher than an acoustic velocity of an acoustic wave generated by the multi-layered piezoelectric device. As used herein, "acoustic velocity" can be the speed of sound of a shear wave propagating in a solid. The high velocity layers can improve confinement of the acoustic wave within the device. As an example, the high velocity layers can be silicon layers in certain applications. The multi-layer piezoelectric device can include a low velocity layer between the piezoelectric layer and one of the high velocity layers. The low velocity layer has a lower acoustic velocity than the high velocity layers. The low velocity layer can be a temperature compensation layer. For example, the low velocity layer can be a silicon dioxide layer. The multi-layer piezoelectric device can generate a boundary acoustic wave and be implemented as a relatively thin device. The multi-layered piezoelectric device can have a thickness on the order of a wavelength of the boundary acoustic wave generated by the device in certain applications.

FIG. 1 illustrates a cross sectional view of an acoustic wave device 10 according to an embodiment. The acoustic wave device 10 can generate a boundary acoustic wave. Accordingly, the acoustic wave device 10 can be referred to as a boundary wave device. The acoustic wave device 10 can have a relatively small height and confine the boundary acoustic wave within the acoustic wave device 10. As illustrated, the acoustic wave device 10 includes a piezoelectric layer 12, an interdigital transducer (IDT) electrode 14, a temperature compensation layer 16, a first high velocity layer 17, and a second high velocity layer 18.

The acoustic wave device 10 is configured to generate a boundary acoustic wave having acoustic energy concentrated at an interface of the piezoelectric layer 12 and the temperature compensation layer 16. The boundary acoustic wave can have a velocity a range from 2500 meters per second to 4800 meters per second. In certain instances, the boundary acoustic wave can have a velocity above 3900 meters per second. In some such instances, the boundary acoustic wave can have a velocity above 4100 meters per second. The velocity of the boundary acoustic wave can be in a range from 3900 meters per second to 4800 meters per second. In some instances, the velocity of the boundary acoustic wave is in a range from 4100 meters per second to 4800 meters per second.

The piezoelectric layer 12 can be any suitable piezoelectric layer for generating an acoustic wave having a wavelength $\lambda$. For example, the piezoelectric layer can be a lithium based piezoelectric layer, such as a lithium tantalate (LiTaO$_3$) layer or a lithium niobate (LiNbO$_3$) layer. The illustrated piezoelectric layer 12 has a thickness $H_1$. The thickness $H_1$ can be on the order of the wavelength $\lambda$. The thickness $H_1$ can be in a range from about $0.1\lambda$ to $5\lambda$. Such a thickness can be sufficiently thin to reduce radiation loss relative to thicker piezoelectric layers. The thickness of the piezoelectric layer 12 can be less than $2\lambda$, such as in a range from $0.1\lambda$ to $2\lambda$. In certain applications, the thickness can be about $1.0\lambda$ for a lithium tantalate piezoelectric layer or a lithium niobate piezoelectric layer.

The IDT electrode 14 is disposed on piezoelectric layer 12. The IDT electrode 14 can generate a boundary acoustic wave at an interface of the piezoelectric layer 12 and the temperature compensation layer 16. The illustrated IDT electrode 14 has a pitch L and a thickness $h_1$. The pitch L can define and correspond to the wavelength $\lambda$ of an acoustic wave generated by the acoustic wave device 10. The thickness $h_1$ can be in a range from about $0.01\lambda$ to $0.15\lambda$. For example, $h_1$ can be about $0.08\lambda$ in certain applications. The IDT electrode 14 can include aluminum, an aluminum alloy, and/or any other suitable material for an IDT electrode 14. For example, IDT electrode material can include aluminum (Al), titanium (Ti), gold (Au), silver (Ag), copper (Cu), platinum (Pt), tungsten (W), molybdenum (Mo), ruthenium (Ru), or any suitable combination thereof. IDT electrode thickness $h_1$ can be relatively thinner when relatively heavy electrodes, such as Au, Ag, Cu, Pt, W, Mo, or Ru, are used.

The temperature compensation layer 16 is positioned between the piezoelectric layer 12 and the first high velocity layer 17. As illustrated, the temperature compensation layer 16 has a first side in physical contact with the piezoelectric layer 12 and a second side in physical contact with the first high velocity layer 17. The temperature compensation layer 16 can improve the temperature coefficient of frequency (TCF) of the acoustic wave device 10 relative to a similar acoustic wave device without the temperature compensation layer 16. The temperature compensation layer 16 can bring the TFC of the acoustic wave device 10 closer to zero than the TCF of a similar acoustic wave device that does not include the temperature compensation layer 16. The temperature compensation layer 16 can have a positive temperature coefficient of frequency. For instance, the temperature compensation layer 16 can be a silicon dioxide (SiO$_2$) layer. The temperature compensation layer 16 can alternatively be a tellurium dioxide (TeO$_2$) layer or a silicon oxyfluoride (SiOF layer). The temperature compensation layer 16 can include any suitable combination of SiO$_2$, TeO$_2$, and/or SiOF.

In certain applications, the temperature compensation layer 16 can improve an electromechanical coupling coefficient $k^2$ of the acoustic wave device 10. The electromechanical coupling coefficient $k^2$ for the acoustic wave device 10 can be greater than 5%. For instance, in certain embodiments, the electromechanical coupling coefficient $k^2$ is around 9%. The electromechanical coupling coefficient $k^2$ can be in a range from 5% to 15% in various applications. The acoustic wave device 10 can have an electromechanical coupling coefficient $k^2$ of up to about 15% when the piezoelectric layer 12 is a lithium niobate layer.

The temperature compensation layer 16 can have a lower bulk velocity than a velocity of the acoustic wave generated by the IDT electrode 14. Accordingly, the temperature compensation layer 16 can be referred to as a low velocity layer. Such a low velocity layer has a lower acoustic velocity than the high velocity layers 17 and 18, in which the acoustic velocity of the low velocity layer is a speed of sound of a shear wave propagating in the low velocity layer. The temperature compensation layer 16 can have a lower acoustic impedance than the piezoelectric layer 12. The temperature compensation layer 16 can have a lower acoustic impedance than the first high velocity layer 17. The temperature compensation layer 16 can be a dielectric layer.

The illustrated temperature compensation layer 16 has a thickness $H_2$. The thickness $H_2$ can be less than $1.0\lambda$. The thickness $H_2$ can be in a range from about $0.05\lambda$ to $1.0\lambda$. In some of these instances, the thickness $H_2$ can be less than $0.5\lambda$.

The first high velocity layer 17 has a higher bulk velocity than a velocity of the acoustic wave generated by the IDT electrode 14. The first high velocity layer 17 can have a higher acoustic impedance than the piezoelectric layer 12. Accordingly, the high velocity layer 17 can be referred to as a high impedance layer. The first high velocity layer 17 can have a higher acoustic impedance than the temperature compensation layer 16. The first high velocity layer 17 can inhibit an acoustic wave generated by the acoustic wave device 10 from leaking out of the device. The acoustic velocity of the high velocity layer 17 is the speed of sound of a shear wave propagating in the high velocity layer 17. The first high velocity layer 17 can be a silicon layer. Such a silicon layer can have a relatively high acoustic velocity, a relatively large stiffness, and a relatively small density. The silicon layer can be a polycrystalline silicon layer in certain instances. In some other instances, the first high velocity layer 17 can be implemented by other suitable material having a higher acoustic velocity than the velocity of the acoustic wave generated by the IDT electrode 14 of the acoustic wave device 10. For instance, the first high velocity layer 17 can include silicon nitride, aluminum nitride, diamond such as synthetic diamond, quartz, spinel, the like, or any suitable combination thereof.

The second high velocity layer 18 can be bonded to and in physical contact with the piezoelectric layer 12. The second high velocity layer 18 has a higher bulk velocity than a velocity of the acoustic wave generated by the IDT electrode 14. Accordingly, the high velocity layer 18 can be referred to as a high impedance layer. The second high velocity layer 18 can have a higher acoustic impedance than the temperature compensation layer 16. The second high velocity layer 18 can have a higher acoustic impedance than piezoelectric layer 12. The second high velocity layer 18 can inhibit an acoustic wave generated by the acoustic wave device 10 from leaking from the device. The acoustic velocity of the high velocity layer 18 is the speed of sound of a shear wave propagating in the high velocity layer 18. The second high velocity layer 18 can be a silicon layer. Such a silicon layer can have a relatively high acoustic velocity, a relatively large stiffness, and a relatively small density. The silicon layer can be a polycrystalline silicon layer in certain instances. In some other instances, the second high velocity layer 18 can be implemented by other suitable material having a higher acoustic velocity than the velocity of the acoustic wave generated by the IDT electrode 14 of the acoustic wave device 10. For instance, the second high velocity layer 18 can include silicon nitride, aluminum nitride, diamond such as synthetic diamond, quartz, spinel, the like, or any suitable combination thereof.

The second high velocity layer 18 can be formed of the same material as the first high velocity layer 17 in certain instances. The second high velocity layer 18 can be formed of a different material than the first high velocity layer 17 in some instances.

Figure 2:
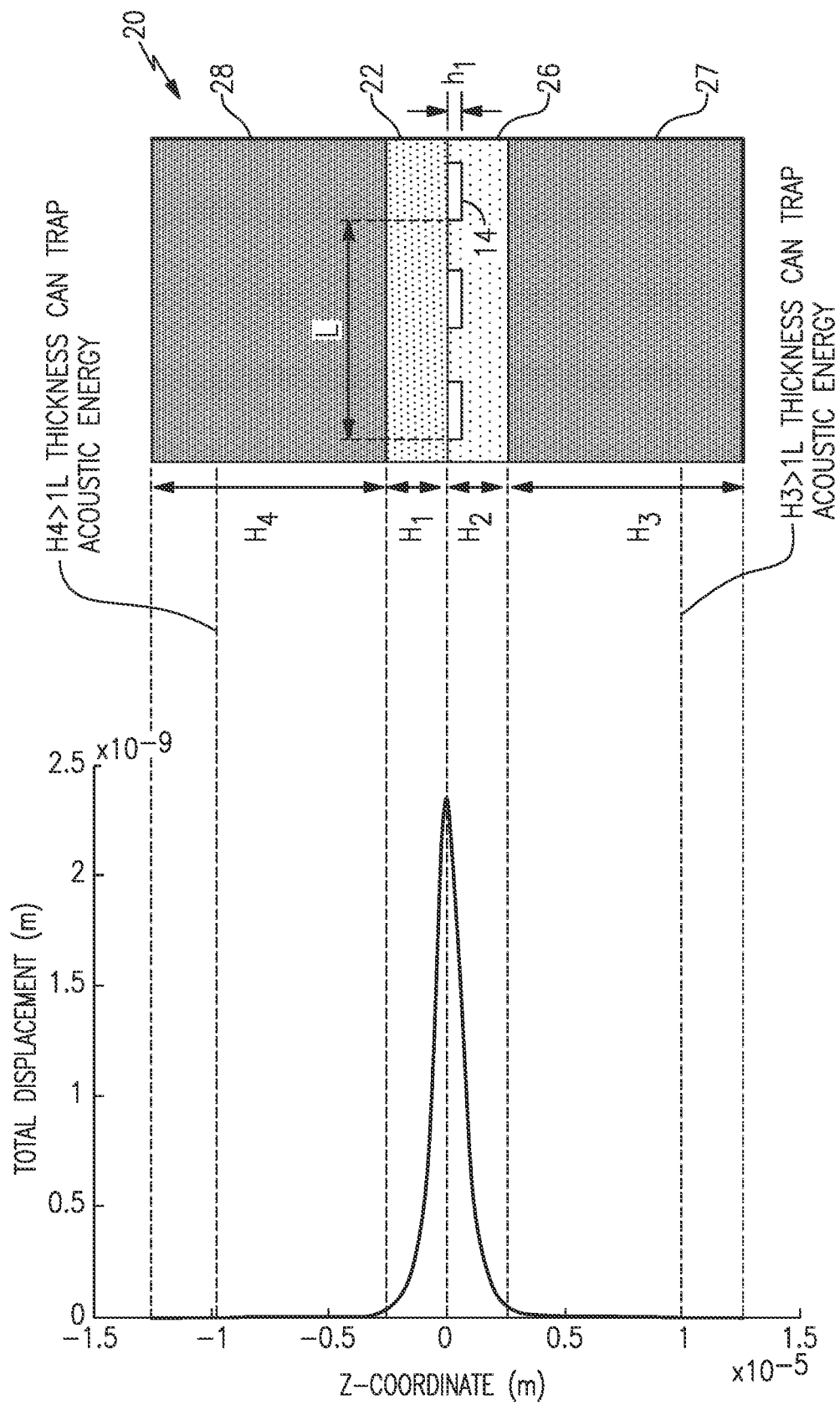
FIG. 2 illustrates a cross sectional view of an acoustic wave device and a simulated acoustic displacement distribution according to an embodiment.

FIG. 2 illustrates a cross sectional view of an acoustic wave device 20 and a simulated acoustic displacement distribution according to an embodiment. The acoustic wave device 20 is an example of the acoustic wave device 10 of FIG. 1. The illustrated acoustic wave device includes a lithium tantalate layer 22, an IDT electrode 14, a silicon dioxide layer 26, a first silicon layer 27, and a second silicon layer 28.

The acoustic displacement distribution graph shown in FIG. 2 indicates that acoustic energy is trapped in the lithium tantalate layer 22 and the silicon dioxide layer 26 in the acoustic wave device 20. The illustrated displacement distribution graph indicates that acoustic energy is concentrated at an interface of the lithium tantalate layer 22 and the silicon dioxide layer 26 in the acoustic wave device 20. The first silicon layer 27 has a thickness $H_3$. The thickness $H_3$ being greater than the wavelength λ of an acoustic wave generated by the acoustic wave device 20 can be sufficient to trap acoustic energy within the acoustic wave device 20. The thickness $H_3$ can be in a range from 1λ to 10λ. In some instances, $H_3$ can be about 5λ. The thickness $H_3$ can be sufficient to maintain mechanical durability of the acoustic wave device 20. In such instances, the thickness $H_3$ can be greater than 10λ. For example, the thickness $H_3$ can be in a range from 1λ to 100λ. The thickness $H_3$ can be less than 200 um, which corresponds to 100λ when λ is um. With the thickness being less than 200 um, the acoustic wave device 20 can be thinner than certain present temperature compensated SAW devices. As another example, the thickness $H_3$ can be in a range from 1λ to 50λ. There is no discernable displacement on a surface of the first silicon layer 27 away from the lithium tantalate layer 22. Similarly, there is no discernable displacement on a surface of the second silicon layer 28 away from the lithium tantalate layer 22. The thickness $H_4$ of the second silicon layer 28 can be similar to the thickness $H_3$ of the first silicon layer 27 in certain implementations. The maximum displacement in the acoustic displacement distribution is centered on the interface of the silicon dioxide layer 26 and the lithium tantalate layer 22. The silicon dioxide layer 26 can cause the TCF to be improved. The silicon dioxide layer 26 can cause the electromechanical coupling coefficient $k^2$ to be improved.

The general relationship shown in the acoustic displacement distribution of FIG. 2 should hold for acoustic wave devices that implement other high impedance materials in place of the silicon layers 27 and/or 28, in which the other high impedance materials have a higher acoustic impedance than the acoustic impedance of a piezoelectric layer of the device. Example high impedance materials include silicon nitride, aluminum nitride, diamond such as synthetic diamond, quartz, spinel, and the like. Similarly, the lithium tantalate layer 22 can be replaced by another suitable piezoelectric layer, such as a lithium niobate layer, and such an acoustic wave device can function similarly to the acoustic wave device 20 of FIG. 2.

In the example distribution graph of FIG. 2, an acoustic wave based on Shear Horizontal (SH) mode is excited using lithium tantalate in 42° rotation Y-cut X propagation as a piezoelectric layer. However, even if different piezoelectric substrate cut angles and/or piezoelectric materials were used with the vibration component-based mode in the longitudinal direction and in the thickness direction for excitation, as long as the acoustic velocity relationship is satisfied, such a device can function similarly as the acoustic wave device 20 of FIG. 2.

Figure 3C:
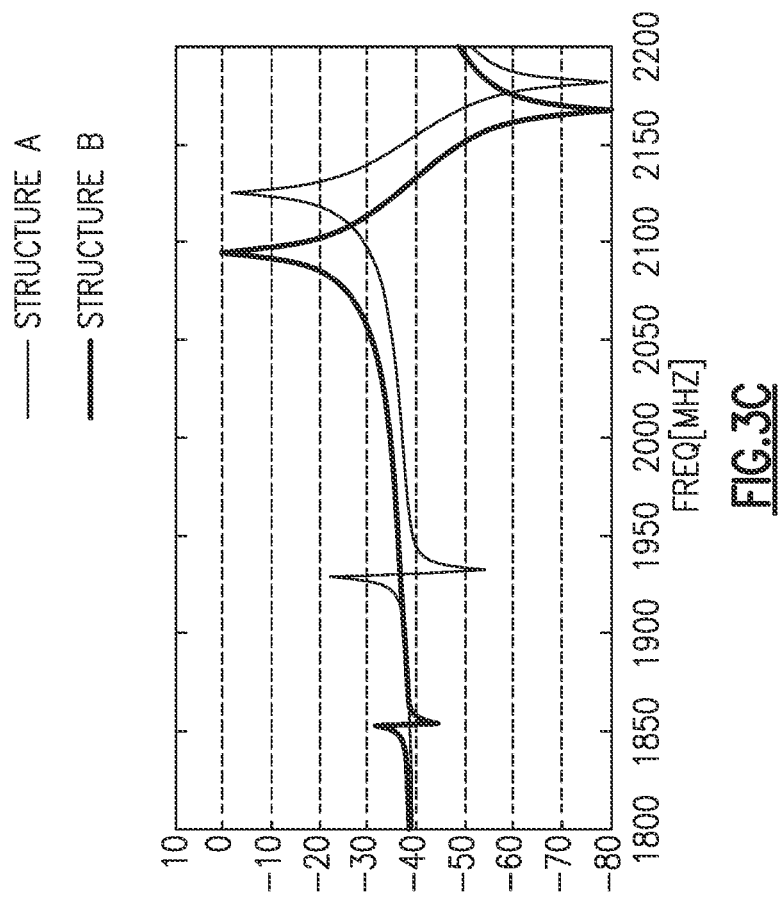
FIG. 3C illustrates a graph comparing performance of the acoustic wave devices of FIGS. 3A and 3B.
Figure 3A:
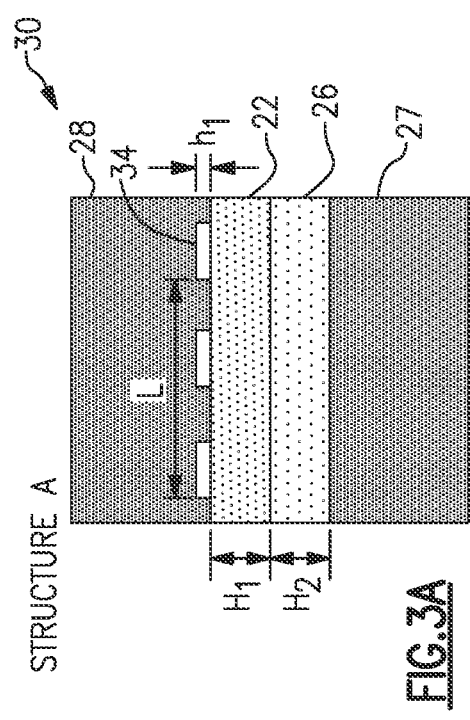
FIG. 3A illustrates a cross sectional view of an acoustic wave device according to an embodiment.

FIG. 3A illustrates a cross sectional view of an acoustic wave device 30 according to an embodiment. The acoustic wave device 30 is like the acoustic wave device 20 of FIG. 2 except that the IDT electrode is disposed on a different surface of the lithium tantalate layer 22 and the IDT electrode is an aluminum IDT electrode 34 in the acoustic wave device 30. As illustrated, the aluminum IDT electrode 34 in FIG. 3A is on a surface of the lithium tantalate layer 22 that is facing the second silicon layer 28.

FIG. 3A illustrates that certain acoustic wave devices can include a high velocity layers on opposing sides of a piezoelectric layer and a low velocity layer on an opposite side of a piezoelectric layer than an IDT electrode, in which the low velocity layer is positioned between the piezoelectric layer and one of the high velocity layers. In certain applications, other high impedance materials can be implemented in place of the silicon layers 27 and/or 28 in the acoustic wave device 30, in which the other high impedance materials have a higher acoustic impedance than the acoustic impedance of a piezoelectric layer of the device. Example high impedance materials include silicon nitride, aluminum nitride, diamond such as synthetic diamond, quartz, spinel, and the like. Similarly, the lithium tantalate layer 22 can be replaced by another suitable piezoelectric layer, such as a lithium niobate layer, and such an acoustic wave device can function similarly to the acoustic wave device 30 of FIG. 3A.

Figure 3B:
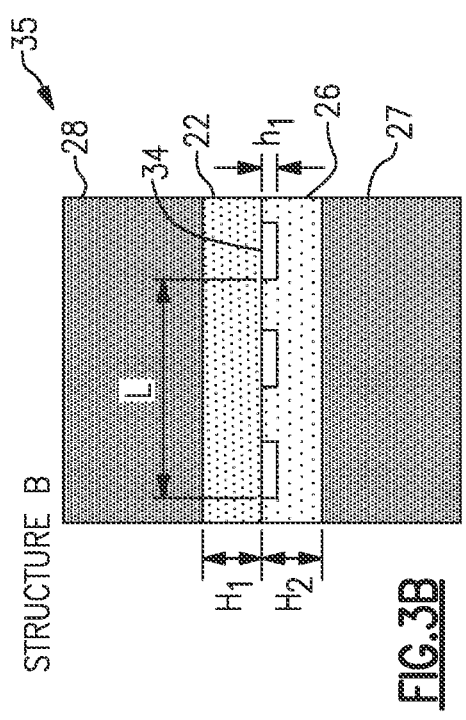
FIG. 3B illustrates a cross sectional view of an acoustic wave device according to an embodiment.

FIG. 3B illustrates a cross sectional view of an acoustic wave device 35 according to an embodiment. The acoustic wave device 35 is like the acoustic wave device 20 of FIG. 2 except that the IDT electrode is an aluminum IDT electrode 34 in the acoustic wave device 35. The aluminum IDT electrode 34 is on the opposite side of the lithium tantalate layer 22 in the acoustic wave device 35 compared to the acoustic wave device 30 of FIG. 3A.

FIG. 3C illustrates a graph comparing performance of the acoustic wave devices 30 and 35 of FIGS. 3A and 3B, respectively. These simulations correspond to acoustic wave devices 30 and 35 having silicon high velocity layers and a lithium tantalate piezoelectric layer. FIG. 3C indicates that the acoustic wave device 35 has a better electromechanical coupling coefficient $k^2$ than the acoustic wave device 30.

A variety of acoustic wave devices with high velocity layers and/or high impedance layers on opposing sides of a piezoelectric layer can generate a boundary acoustic wave. Some examples acoustic wave devices are discussed with reference to FIGS. 1 to 3B. Additional example acoustic wave devices will be discussed with reference to FIGS. 4A to 4G. Any suitable features of the acoustic wave devices disclosed herein can be implemented together with each other.

Figure 4A:
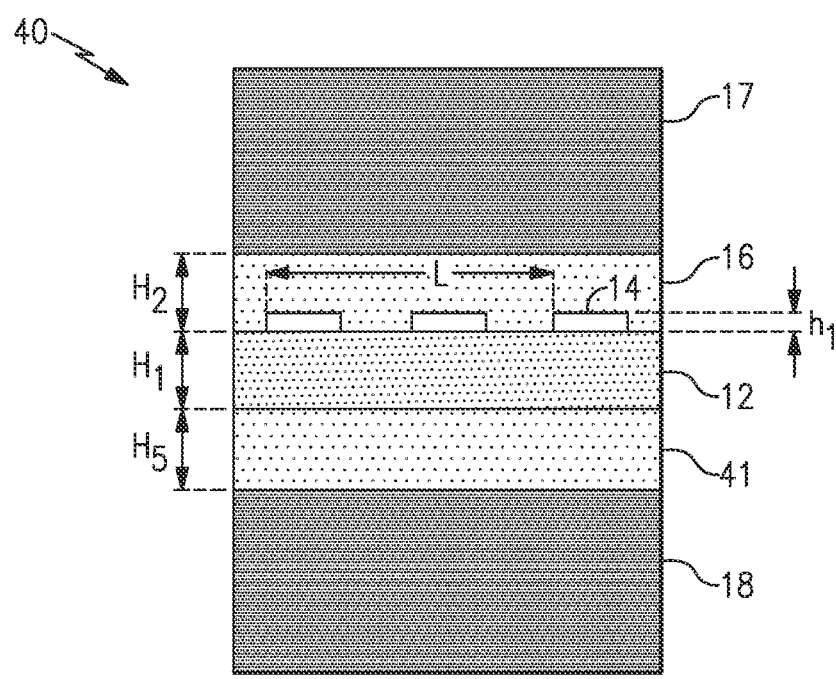
FIG. 4A illustrates a cross sectional view of an acoustic wave device according to an embodiment.

FIG. 4A illustrates a cross sectional view of an acoustic wave device 40 according to an embodiment. The acoustic wave device 40 is like the acoustic wave device 10 of FIG. 1 except that an additional low velocity layer 41 is included between the second high velocity layer and the piezoelectric layer 12. Although the acoustic wave device 40 is illustrated in a different orientation than the acoustic wave device 10, the way the devices are illustrated does not impact functionality of the devices or imply an orientation of the physical device. The low velocity layer 41 can alternatively be referred to as a low impedance layer. The low velocity layer 41 can be a silicon dioxide layer. In an embodiment of the acoustic wave device 40, the first high velocity layer 17 can be a silicon layer, the first low velocity layer 16 can be a silicon dioxide layer, the second low velocity layer 41 can be a silicon dioxide layer, and the second high velocity layer 18 can be a silicon layer.

Figure 4B:
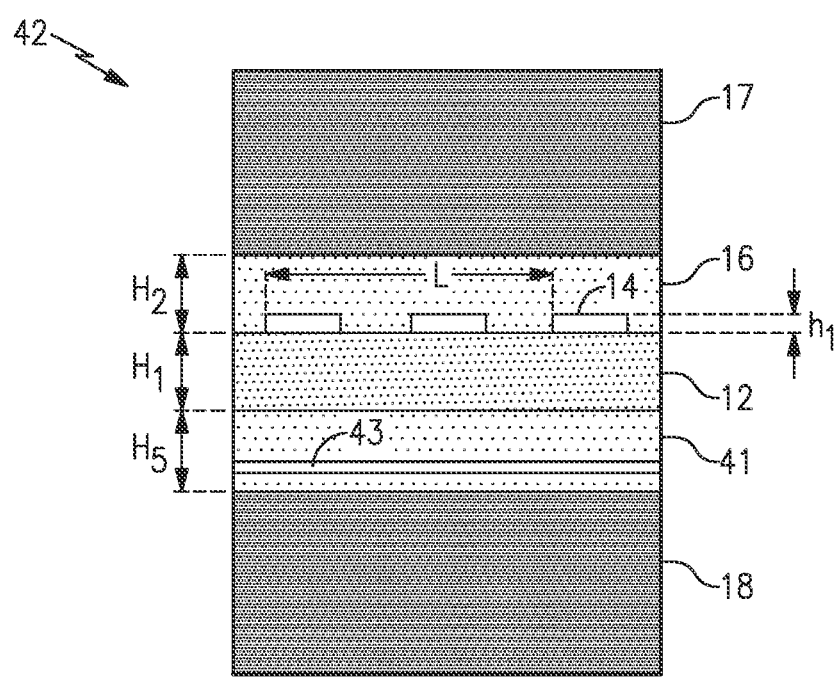
FIG. 4B illustrates a cross sectional view of an acoustic wave device according to another embodiment.

FIG. 4B illustrates a cross sectional view of an acoustic wave device 42 according to an embodiment. The acoustic wave device 42 is like the acoustic wave device 40 of FIG. 4A except that an adhesion layer 43 is included within the second low velocity layer 41 in the acoustic wave device 42. The adhesion layer 43 enhances adhesion strength between layers of the acoustic wave device 42. The adhesion layer 43 can include a metal such as aluminum (Al), titanium (Ti), iron (Fe), or the like. When the adhesion layer 43 is metal, the adhesion layer 43 can improve interlayer thermal conductivity and/or suppress self-heating of the acoustic wave device 42. In some instances, such an adhesion layer 43 can enhance power durability of the acoustic wave device 42. The adhesion layer 43 can be a dielectric material in some applications. The adhesion layer 43 can be spaced from the piezoelectric layer 12 by a sufficient distance such that the adhesion layer 43 does not significantly degrade transmission characteristics of the acoustic wave device 42. In the acoustic wave device 42, the second low velocity layer 41 can be separated into a first portion and a second portion by the adhesion layer 43, in which the first portion is between the piezoelectric layer 12 and the adhesion layer 43 and the second portion is between the adhesion layer 43 and the second high velocity layer 18. In an embodiment of the acoustic wave device 42, the first high velocity layer 17 is a silicon layer, the first low velocity layer 16 is a silicon dioxide layer, the second low velocity layer 41 is a silicon dioxide layer, and the second high velocity layer 18 is a silicon layer.

Figure 4C:
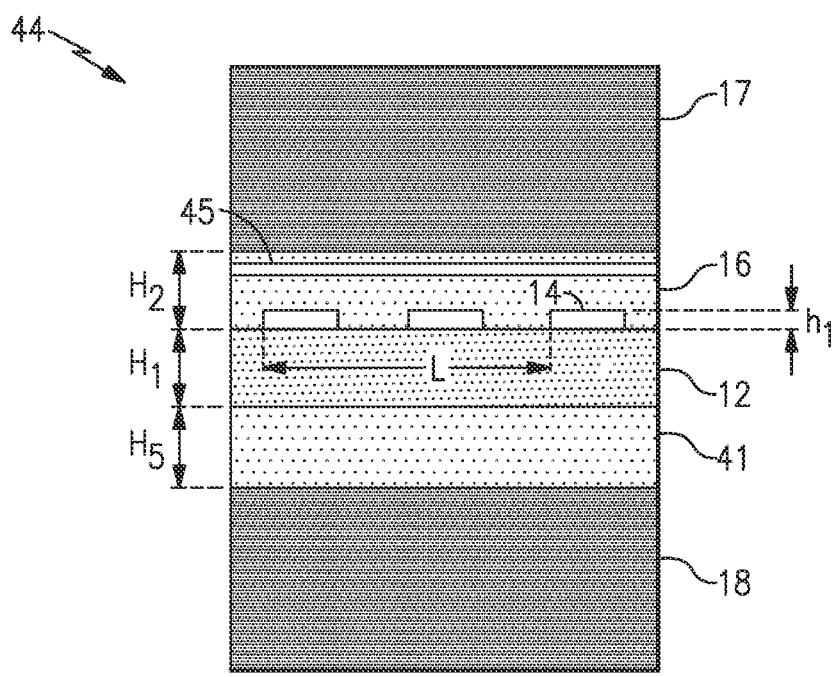
FIG. 4C illustrates a cross sectional view of an acoustic wave device according to another embodiment.

FIG. 4C illustrates a cross sectional view of an acoustic wave device 44 according to an embodiment. The acoustic wave device 44 is like the acoustic wave device 40 of FIG. 4A except that an adhesion layer 45 is included within the first low velocity layer 16 in the acoustic wave device 44. The adhesion layer 45 enhances adhesion strength between layers of the acoustic wave device 44. The adhesion layer 45 can include a metal such as aluminum, titanium, iron, or the like. When the adhesion layer 45 is metal, the adhesion layer 45 can improve interlayer thermal conductivity and/or suppress self-heating of the acoustic wave device 44. In some instances, such an adhesion layer 45 can enhance power durability of the acoustic wave device 44. The adhesion layer 45 can be a dielectric material in some applications. The adhesion layer 45 can be spaced from the piezoelectric layer 12 and the IDT electrode 14 by a sufficient distance such that the adhesion layer 45 does not significantly degrade transmission characteristics of the acoustic wave device 44. In the acoustic wave device 44, the first low velocity layer 16 can be separated into a first portion and a second portion by the adhesion layer 45, in which the first portion is between the piezoelectric layer 12 and the adhesion layer 45 and the second portion is between the adhesion layer 45 and the first high velocity layer 17. In an embodiment of the acoustic wave device 44, the first high velocity layer 17 is a silicon layer, the first low velocity layer 16 is a silicon dioxide layer, the second low velocity layer 41 is a silicon dioxide layer, and the second high velocity layer 18 is a silicon layer.

Figure 4D:
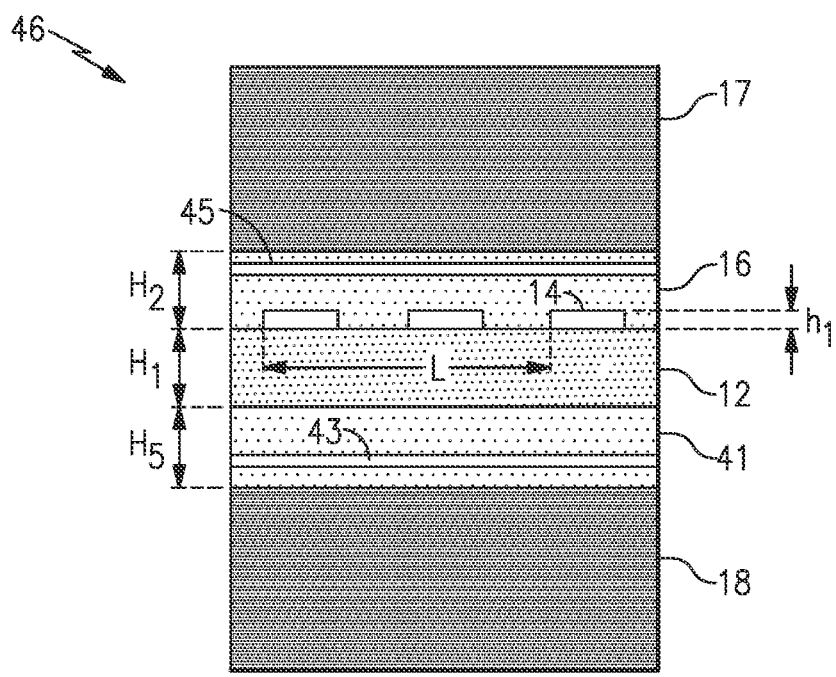
FIG. 4D illustrates a cross sectional view of an acoustic wave device according to another embodiment.

FIG. 4D illustrates a cross sectional view of an acoustic wave device 46 according to an embodiment. The acoustic wave device 46 is like the acoustic wave device 42 of FIG. 4B except that the acoustic wave device 46 additionally includes the adhesion layer 45. Similarly, the acoustic wave device 46 is like the acoustic wave device 44 of FIG. 4C except that the acoustic wave device 46 additionally includes the adhesion layer 43. Having adhesion layers 43 and 45 can improve adhesion of layers of the acoustic wave device 46. Moreover, when the adhesion layers 43 and 45 are metal, interlayer thermal conductivity can be improved and/or self-heating can be suppressed. In an embodiment of the acoustic wave device 46, the first high velocity layer 17 is a silicon layer, the first low velocity layer 16 is a silicon dioxide layer, the second low velocity layer 41 is a silicon dioxide layer, and the second high velocity layer 18 is a silicon layer.

Figure 4E:
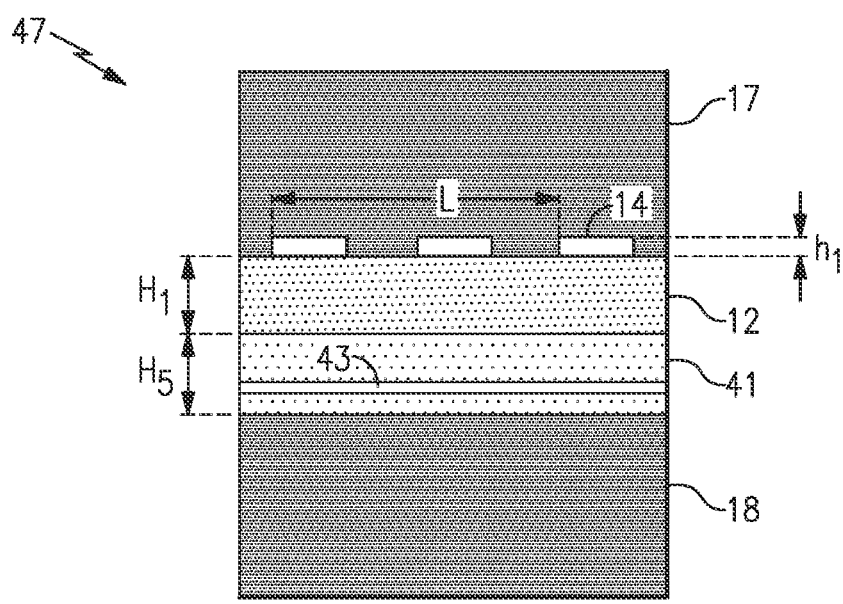
FIG. 4E illustrates a cross sectional view of an acoustic wave device according to another embodiment.

FIG. 4E illustrates a cross sectional view of an acoustic wave device 47 according to an embodiment. As illustrated, the acoustic wave device 47 includes a piezoelectric layer 12, an IDT electrode 14 on the piezoelectric layer 12, a first high velocity layer 17 over the IDT electrode 14 and the piezoelectric layer 12, a second high velocity layer 18 on an opposite side of the piezoelectric layer 12 than the IDT electrode 14, and a low velocity layer 41 positioned between the piezoelectric layer 12 and the second high velocity layer 18. An adhesion layer 43 is included within the low velocity layer 41. In an embodiment of the acoustic wave device 47, the first high velocity layer 17 is a silicon layer, the first low velocity layer 16 is a silicon dioxide layer, the second low velocity layer 41 is a silicon dioxide layer, and the second high velocity layer 18 is a silicon layer. An embodiment of the acoustic wave device 47 is similar to the acoustic wave device 30 of FIG. 3A with the adhesive layer 43 added.

Figure 4F:
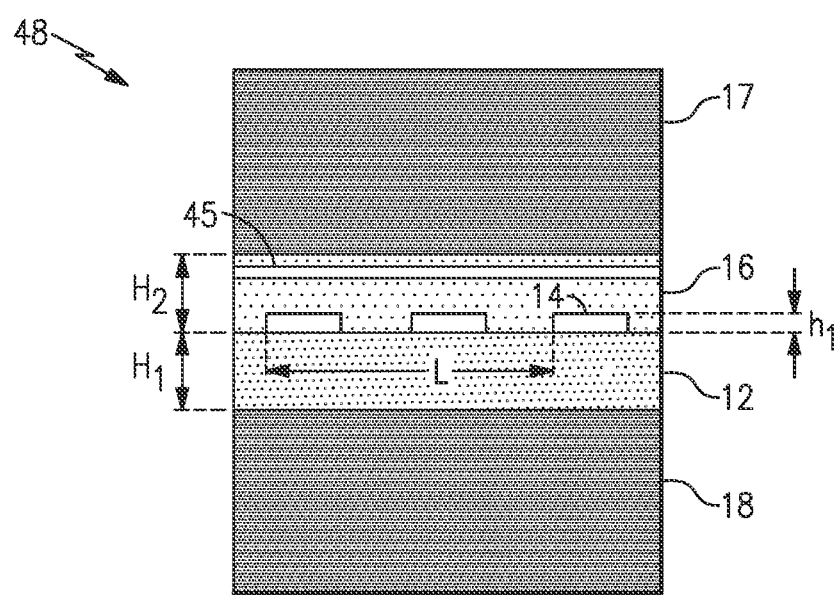
FIG. 4F illustrates a cross sectional view of an acoustic wave device according to another embodiment.

FIG. 4F illustrates a cross sectional view of an acoustic wave device 48 according to an embodiment. The acoustic wave device 48 is like the acoustic wave device 10 of FIG. 1 except that the adhesive layer 45 is included within the low velocity layer 16 in the acoustic wave device 48. In an embodiment of the acoustic wave device 48, the first high velocity layer 17 is a silicon layer, the low velocity layer 16 is a silicon dioxide layer, and the second low velocity layer 18 is a silicon layer. The adhesion layer 45 can improve adhesion between layers in the acoustic wave device 45. When the adhesion layer 45 is metal, interlayer thermal conductivity can be improved and/or self-heating can be suppressed.

Figure 4G:
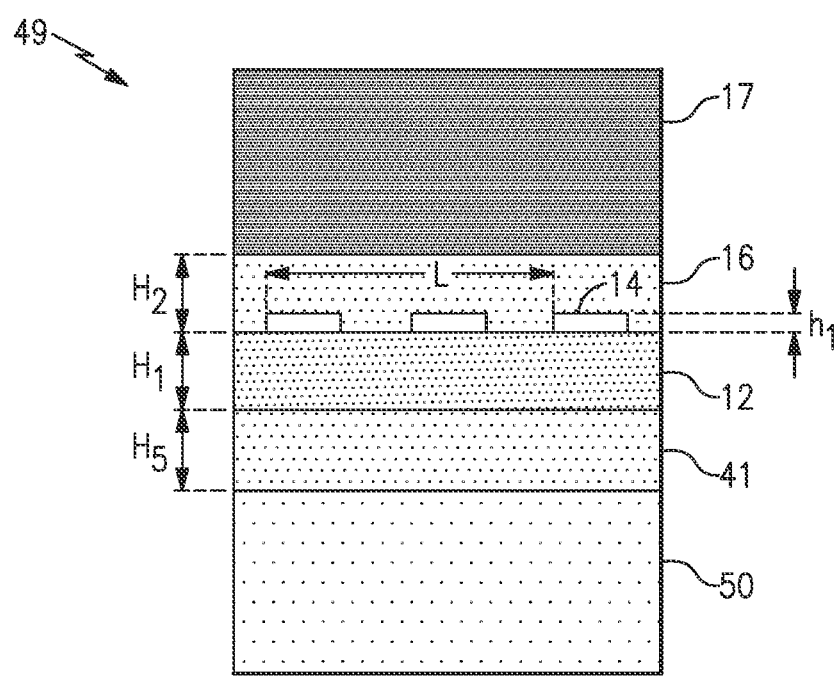
FIG. 4G illustrates a cross sectional view of an acoustic wave device according to another embodiment.

FIG. 4G illustrates a cross sectional view of an acoustic wave device 49 according to an embodiment. The acoustic wave device 49 is like the acoustic wave device 40 of FIG. 4A except that a second high velocity layer 50 is shown as being a different material than the first high velocity layer 17. As an example, the first high velocity layer 17 can be a silicon layer and the second high velocity layer 50 can be a quartz layer. Any other suitable combinations of high velocity layers can be implemented. FIG. 4G is an illustrative example that an acoustic wave device in accordance with any suitable principles and advantages disclosed herein can include a first high velocity layer of a different material than a second high velocity layer. In an embodiment of the acoustic wave device 49, the first high velocity layer 17 is a silicon layer, the first low velocity layer 16 is a silicon dioxide layer, the second low velocity layer 41 is a silicon dioxide layer, and the second high velocity layer 50 is a quartz layer.

The high velocity layers, such as silicon layers, in embodiments discussed herein can make acoustic waves impervious to external influences. Accordingly, such acoustic wave devices can be stacked with each other.

An acoustic wave device with a multi-layer piezoelectric substrate in accordance with the principles and advantages discussed herein, for example, with reference to FIGS. 1 to 3B and 4A to 4G, can be implemented by a relatively thin structure. This can be advantageous for packaging. For example, with relatively thin acoustic wave devices, two or more die that include such acoustic wave devices can be stacked with each other within a package. A radio frequency module that includes two stacked die with acoustic wave devices in accordance with the principles and advantages disclosed herein can have a thickness of less than 300 micrometers. In some instances, a radio frequency module that includes three or more stacked die with acoustic wave devices in accordance with the principles and advantages disclosed herein can have a thickness of less than 300 micrometers. The stacked die can be over-molded without additional protection in certain applications. Stacking can be implemented at a device level, the die level, and/or at a module level.

Figure 5:
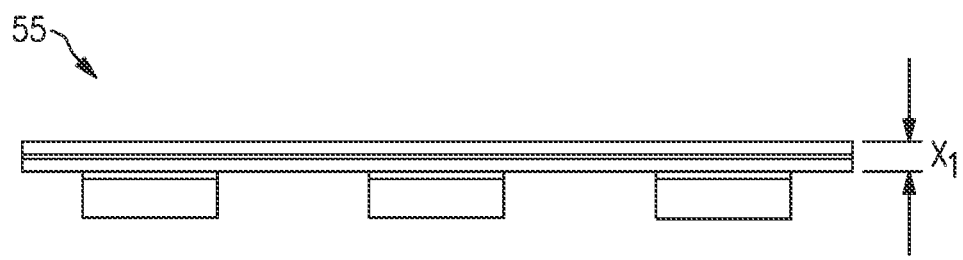
FIG. 5 illustrates another cross sectional view of an acoustic wave device according to an embodiment.

FIG. 5 illustrates another cross sectional view of an acoustic wave device 55 according to an embodiment. The acoustic wave device 55 can include a multi-layer piezoelectric substrate in accordance with any suitable principles and advantages discussed herein. The acoustic wave device 55 is thin. The acoustic wave device 55 is thinner than the certain conventional SAW devices even if the thickness of the high acoustic velocity layers of the acoustic wave device 55 is sufficient to confine the acoustic wave in the vicinity of the piezoelectric layer. In an embodiment, the acoustic wave device 55 can include silicon high velocity layers having thicknesses of around 5λ. Such an acoustic wave device 55 can have a thickness $X_1$ in a range from about 10 micrometers (um) to 100 um. As one example, the thickness $X_1$ can be about 40 um. Other acoustic wave devices disclosed above can also have a thickness in a range from 10 um to 100 um. In contrast, some present temperature compensated SAW (TCSAW) filters include an acoustic wave device with a thickness of around 215 um. The higher end of the range for the thickness $X_1$ for the acoustic wave device 55 can be set by mechanical ruggedness considerations.

Relatively thin acoustic wave devices can be stacked in a filter assembly. This can reduce size of a packaged module that includes acoustic wave devices. With relatively thin acoustic wave devices, vias can be made through such devices. Stacked acoustic wave devices can be connected to other components by electrical connections, such vias and/or wire bonds. Stacked acoustic wave devices can be included in different acoustic wave filters. Such acoustic wave filters can include one or more ladder filters. The one or more ladder filters can include series and shunt one port acoustic wave resonators. FIGS. 6A to 6E illustrate example stacked acoustic wave device assemblies. Any suitable principles and advantages of these examples can be implemented in combination with each other. Any of the acoustic wave devices discussed above and/or any suitable combination of features of the acoustic wave devices discussed above can be implemented in any of the example stacked acoustic wave device assemblies of FIGS. 6A to 6E.

Figure 6A:
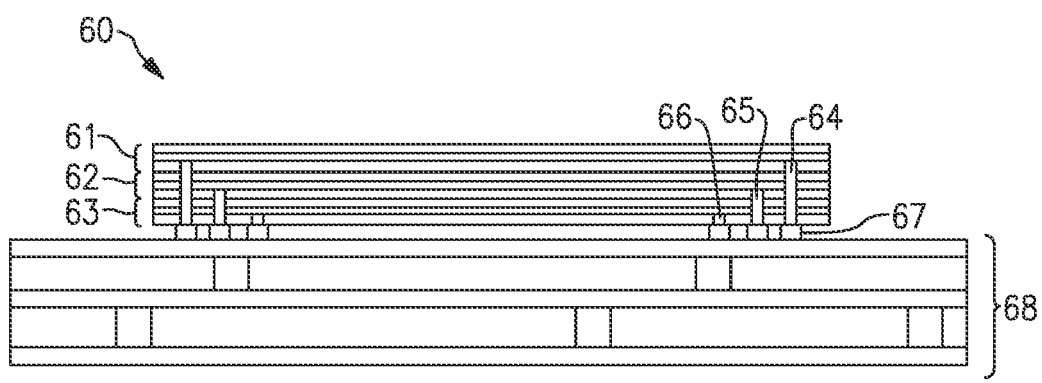
FIG. 6A illustrates an acoustic wave device assembly of stacked acoustic wave devices with a via extending through an acoustic wave device according to an embodiment.

FIG. 6A illustrates an acoustic wave device assembly 60 of stacked acoustic wave devices according to an embodiment. The acoustic wave device assembly 60 is compact and has a relatively small size. As illustrated, the acoustic wave device assembly 60 includes die 61, 62, and 63, vias 64, 65, and 66, contacts 67, and a packaging substrate 68. The die 61, 62, and 63 are stacked with each other. Each of these die can include one or more acoustic wave devices in accordance with any suitable principles and advantages discussed herein. Vias 64, 65, and 66 can provide electrical connections between die 61, 62, and 63, respectively, and contacts 67 on the packaging substrate 68. Via holes through relatively thin piezoelectric layers and acoustic wave devices can be implemented more easily than though thicker layers and devices. The packaging substrate 68 can be a laminate substrate that includes metal routing.

Figure 6B:
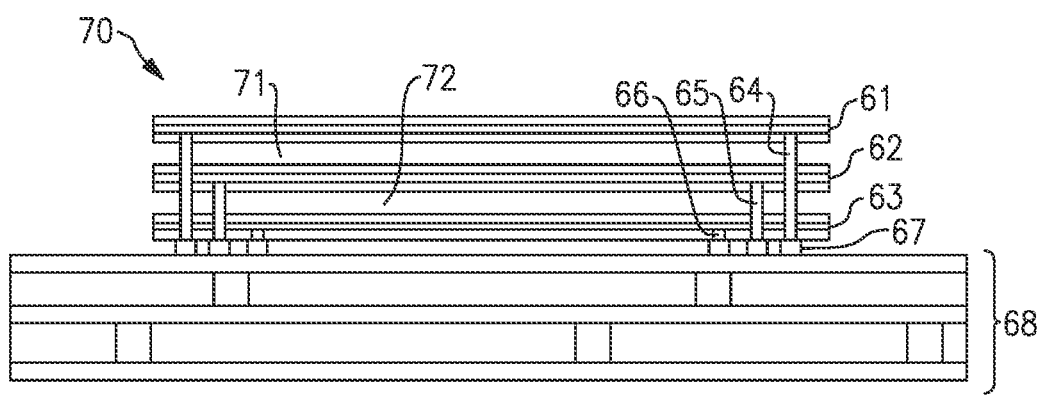
FIG. 6B illustrates an acoustic wave device assembly of stacked acoustic wave devices with an air gap between acoustic wave devices and a via extending through an acoustic wave device according to an embodiment.

FIG. 6B illustrates an acoustic wave device assembly 70 of stacked acoustic wave devices according to an embodiment. The acoustic wave device assembly 70 includes die 61, 62, and 63, vias 64, 65, and 66, contacts 67, a packaging substrate 68, and air gaps 71 and 72 between die. The acoustic wave device assembly 70 includes stacked die with a via though at least one of the die. As illustrated, the via 64 extends though die 62 and 63 and the via 65 extends through die 63. The die 61 and 62 are suspended over air gaps 71 and 72, respectively. The air gaps 71 and 72 can improve electrical isolation of each die relative to the acoustic wave device assembly 60 of FIG. 6A.

Figure 6C:
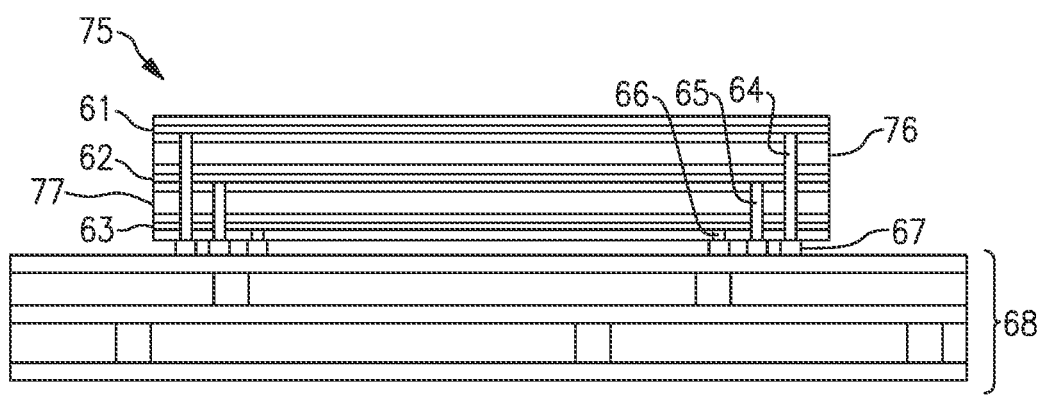
FIG. 6C illustrates an acoustic wave device assembly of stacked acoustic wave devices with dielectric material between acoustic wave devices and a via extending through an acoustic wave device according to an embodiment.

FIG. 6C illustrates an acoustic wave device assembly 75 of stacked acoustic wave devices according to an embodiment. The acoustic wave device assembly 75 includes die 61, 62, and 63, vias 64, 65, and 66, contacts 67, a packaging substrate 68, and dielectric layers 76 and 77. The acoustic wave device assembly 75 includes stacked die with a via though at least one of the die. The dielectric layers 76 and 77 can electrically isolate the die from each other. For example, the dielectric layer 76 provides electrical isolation between the die 61 and the die 62. As another example, the dielectric layer 77 provides electrical isolation between the die 62 and the die 63. The dielectric layers 76 and 77 can maintain mold strength of a packaged device.

Figure 6D:
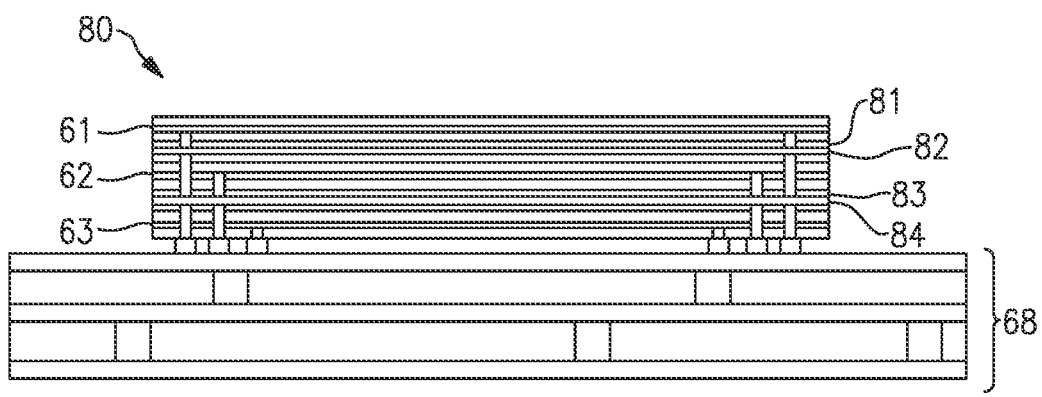
FIG. 6D illustrates an acoustic wave device assembly of stacked acoustic wave devices with dielectric material and a metal shield between acoustic wave devices and a via extending through an acoustic wave device according to an embodiment.

FIG. 6D illustrates an acoustic wave device assembly of stacked acoustic wave devices 80 according to an embodiment. The acoustic wave device assembly 80 includes die 61, 62, and 63, vias 64, 65, and 66, contacts 67, a packaging substrate 68, dielectric layers 81 and 83, and shielding layers 82 and 84. The acoustic wave device assembly 80 includes stacked die with a via though at least one of the die. A dielectric layer and shielding layer between the dies can electrically isolate and shield the dies from each other. For example, the dielectric layer 81 and the shielding layer 82 can provide electrical isolation and shielding between the die 61 and the die 62. As another example, the dielectric layer 83 and the shielding layer 84 can provide electrical isolation and shielding between the die 62 and the die 63. The shielding layers 82 and 84 can be implemented by any suitable shielding metal layers.

Figure 6E:
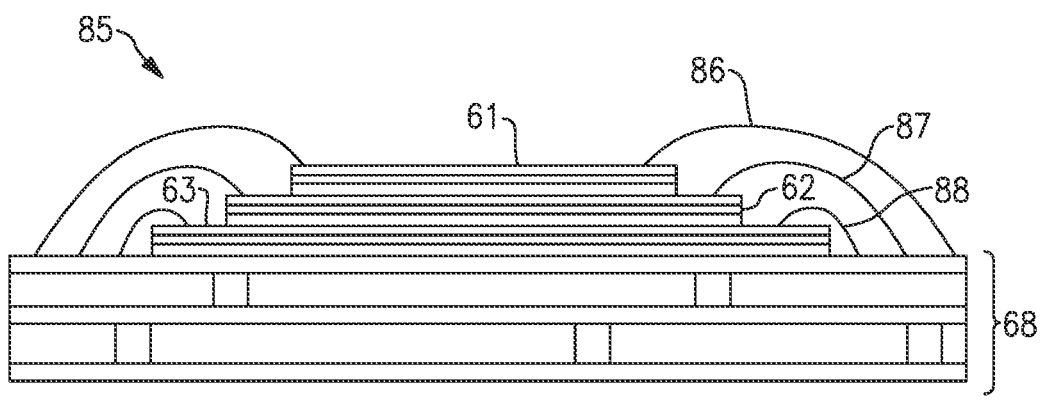
FIG. 6E illustrates an acoustic wave device assembly of stacked acoustic wave devices with wire bonds extending from acoustic wave devices according to an embodiment.

FIG. 6E illustrates an acoustic wave device assembly 85 of stacked acoustic wave devices according to an embodiment. The acoustic wave device assembly 85 includes die 61, 62, and 63, wire bonds 86, 87, and 88, and a packaging substrate 68. The wire bonds 86, 87, and 88 can provide electrical connections between die 61, 62, and 63, respectively, and the packaging substrate 68. A wire bonds 86, 87, and 88 can each extend from a respective wire bond pad on die 61, 62, and 63 to a respective pad on the packaging substrate 68. Wire bonds and vias extending through a die can be implemented with each other in some other embodiments to provide electrical connections between one or more die and metal routing of a packaging substrate. An air gap and/or a dielectric layer and/or a shielding layer can be implemented between die of a stacked acoustic wave assembly, in which one or more of the die has a wire bond extending therefrom.

Figure 7A:
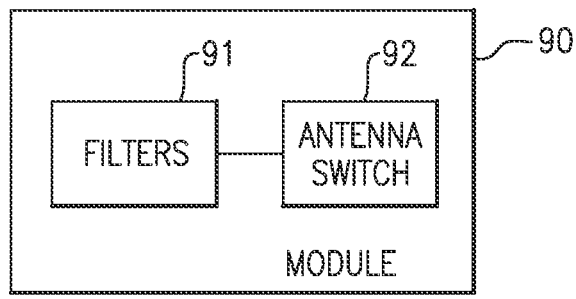
FIG. 7A is a schematic block diagram of a module that includes a filter and an antenna switch according to an embodiment.
Figure 7B:
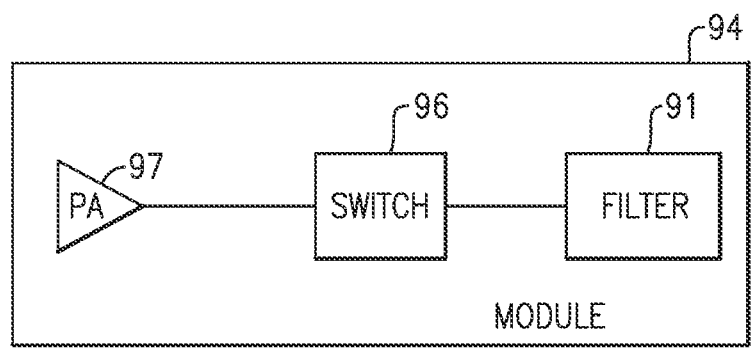
FIG. 7B is a schematic block diagram of a module that includes a power amplifier, a switch, and a filter according to an embodiment.
Figure 7C:
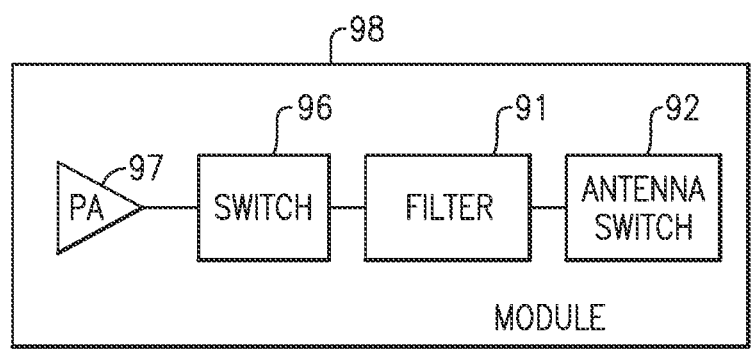
FIG. 7C is a schematic block diagram of a module that includes power amplifier, a switch, a filter, and an antenna switch according to an embodiment.

The acoustic wave devices and/or acoustic wave device assemblies discussed herein can be implemented in a variety of packaged modules. Some example packaged modules will now be discussed in which any suitable principles and advantages of the acoustic wave devices discussed herein can be implemented. The example packaged modules can include a package that encloses the illustrated circuit elements. The illustrated circuit elements can be disposed on a common packaging substrate. The packaging substrate can be a laminate substrate, for example. FIGS. 7A, 7B, and 7C are schematic block diagrams of illustrative packaged modules according to certain embodiments. Any suitable combination of features of these packaged modules can be implemented together with each other.

FIG. 7A is a schematic block diagram of a module 90 that includes filters 91 and an antenna switch 92. The module 90 can include a package that encloses the illustrated elements. The filters 91 and the antenna switch 92 can be disposed on a common packaging substrate. The packaging substrate can be a laminate substrate, for example. The filters 91 can include one or more suitable acoustic wave devices disclosed herein. The filters 91 can include die stacked with each other, in which the die include one or more acoustic wave devices disclosed herein. The antenna switch 92 can be a multi-throw radio frequency switch. The antenna switch 92 can electrically couple a selected filter of the filter 91 to an antenna port of the module 90. The filters 91 can include two or more acoustic wave filters coupled together at a common node and arranged as a multiplexer. Such a multiplexer can be a duplexer, a quadplexer, a hexaplexer, an octoplexer, or the like.

FIG. 7B is a schematic block diagram of a module 94 that includes filters 91, a radio frequency switch 96, and a power amplifier 97. The power amplifier 97 can amplify a radio frequency signal. The radio frequency switch 96 can electrically couple an output of the power amplifier 97 to a selected filter of the filters 91. The filters 91 can include one or more acoustic wave devices disclosed herein. The filters 91 can include die stacked with each other, in which the die include one or more acoustic wave devices disclosed herein. The filters 91 can include two or more acoustic wave filters coupled together at a common node and arranged as a multiplexer. Such a multiplexer can be a duplexer, a quadplexer, a hexaplexer, an octoplexer, or the like.

FIG. 7C is a schematic block diagram of a module 98 that includes a power amplifier 97, a radio frequency switch 96, filters 91, and an antenna switch 92. The module 98 is similar to the module 94 of FIG. 7B, except the module 98 additionally includes the antenna switch 92.

Figure 8:
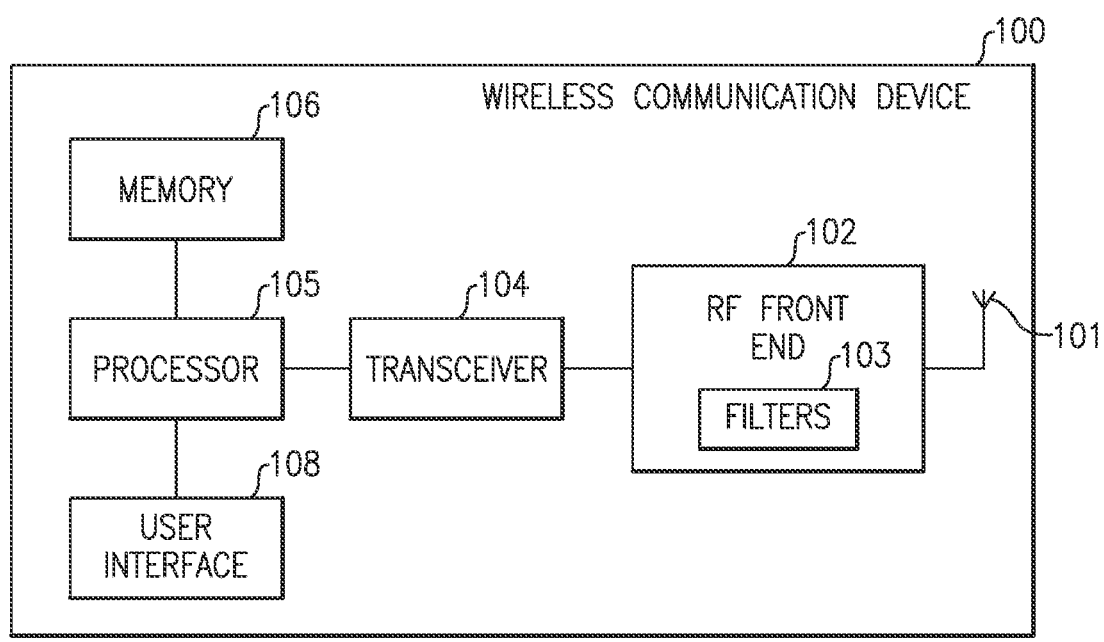
FIG. 8 is a schematic block diagram of a wireless communication device that includes a filter in accordance with one or more embodiments.

Any of the acoustic wave devices, acoustic wave device assemblies, and/or packaged modules can be implemented in a wireless communication device. FIG. 8 is a schematic block diagram of a wireless communication device 100 that includes filters 103 in accordance with one or more embodiments. The wireless communication device 100 can be any suitable wireless communication device. For instance, a wireless communication device 100 can be a mobile phone, such as a smart phone. As illustrated, the wireless communication device 100 includes an antenna 101, an RF front end 102, an RF transceiver 104, a processor 105, a memory 106, and a user interface 108. The antenna 101 can transmit RF signals provided by the RF front end 102. Such RF signals can include carrier aggregation signals. The antenna 101 can provide received RF signals to the RF front end 102 for processing. The wireless communication device 100 can include two or more antennas in certain instances.

The RF front end 102 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 102 can transmit and receive RF signals associated with any suitable communication standards. Any of the acoustic wave devices disclosed herein can be implemented in the filters 103 of the RF front end 102. Any of the acoustic wave device assemblies disclosed herein can implement one or more of the filters 103. Accordingly, the filters 103 can include a relatively thin acoustic wave device arranged to generate a boundary acoustic wave.

The RF transceiver 104 can provide RF signals to the RF front end 102 for amplification and/or other processing. The RF transceiver 104 can also process an RF signal provided by a low noise amplifier of the RF front end 102. The RF transceiver 104 is in communication with the processor 105. The processor 105 can be a baseband processor. The processor 105 can provide any suitable base band processing functions for the wireless communication device 100. The memory 106 can be accessed by the processor 105. The memory 106 can store any suitable data for the wireless communication device 100. The user interface 108 can be any suitable user interface, such as a display with touch screen capabilities.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as in a range from about 450 MHz to 6 GHz. Acoustic wave filters disclosed herein can be band pass filters having a passband that is within a frequency range from about 450 MHz to 6 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A boundary acoustic wave device configured to generate a boundary acoustic wave having a wavelength of λ, the boundary acoustic wave device comprising:
   a piezoelectric layer;
   an interdigital transducer electrode on the piezoelectric layer;
   high acoustic velocity layers on opposing sides of the piezoelectric layer, the high acoustic velocity layers including a first high acoustic velocity layer and a second high acoustic velocity layer, the first high acoustic velocity layer having a thickness of at least 10λ; and
   a low acoustic velocity layer positioned between the piezoelectric layer and one of the high acoustic velocity layers, the low acoustic velocity layer having a lower acoustic velocity than the high acoustic velocity layers.

2. A boundary acoustic wave device configured to generate a boundary acoustic wave, the boundary acoustic wave device comprising:
   a piezoelectric layer;
   an interdigital transducer electrode on the piezoelectric layer;
   high acoustic velocity layers on opposing sides of the piezoelectric layer, the high acoustic velocity layers including a first high acoustic velocity layer and a second high acoustic velocity layer;
   a low acoustic velocity layer positioned between the piezoelectric layer and one of the high acoustic velocity layers, the low acoustic velocity layer having a lower acoustic velocity than the high acoustic velocity layers; and
   a metal layer within the low acoustic velocity layer.

3. The boundary acoustic wave device of claim 1 wherein the high acoustic velocity layers are silicon layers.

4. The boundary acoustic wave device of claim 3 wherein the low acoustic velocity layer is a silicon dioxide layer.

5. The boundary acoustic wave device of claim 1 wherein the thickness of the first high acoustic velocity layer is sufficient to maintain mechanical durability of the boundary acoustic wave device.

6. The boundary acoustic wave device of claim 2 wherein the boundary acoustic wave has a combined thickness in a range from 10 micrometers to 100 micrometers, the combined thickness including thicknesses of the piezoelectric layer and the high acoustic velocity layers and the low acoustic velocity layer.

7. The boundary acoustic wave device of claim 1 wherein the boundary acoustic wave has a combined thickness in a range from 10 micrometers to 100 micrometers, the combined thickness including thicknesses of the piezoelectric layer and the high acoustic velocity layers and the low acoustic velocity layer.

8. An acoustic wave filter comprising:
the boundary acoustic wave device of claim 1; and
a plurality of acoustic wave resonators, the plurality of acoustic wave resonators and the boundary acoustic wave device together configured to filter a radio frequency signal.

9. A boundary acoustic wave device configured to generate a boundary acoustic wave, the boundary acoustic wave device comprising:
a piezoelectric layer;
an interdigital transducer electrode on the piezoelectric layer;
high acoustic velocity layers on opposing sides of the piezoelectric layer, the high acoustic velocity layers including a first high acoustic velocity layer and a second high acoustic velocity layer;
a low acoustic velocity layer positioned between the piezoelectric layer and one of the high acoustic velocity layers, the low acoustic velocity layer having a lower acoustic velocity than the high acoustic velocity layers; and
an adhesion layer within the low acoustic velocity layer.

10. The boundary acoustic wave device of claim 1 wherein low acoustic velocity layer is positioned between the interdigital transducer electrode and the one of the high acoustic velocity layers.

11. The boundary acoustic wave device of claim 10 further comprising a second low acoustic velocity layer, the one of the high acoustic velocity layers being the first high acoustic velocity layer, and the second low acoustic velocity layer being positioned between the piezoelectric layer and the second high acoustic velocity layer.

12. An acoustic wave device assembly comprising:
a first die including a first boundary acoustic wave device configured to generate a boundary acoustic wave having a wavelength of $\lambda$, the first boundary acoustic wave device including a piezoelectric layer, an interdigital transducer electrode on the piezoelectric layer, first and second high acoustic velocity layers on opposing sides of the piezoelectric layer, and a low acoustic velocity layer positioned between the piezoelectric layer and the first high acoustic velocity layer, the low acoustic velocity layer having a lower acoustic velocity than the first high acoustic velocity layer, and the first high acoustic velocity layer having a thickness of at least $10\lambda$; and
a second die stacked with the first die, the second die including a second boundary acoustic wave device.

13. The boundary acoustic wave device of claim 9 wherein the first high acoustic velocity layer has a thickness sufficient to maintain mechanical durability of the boundary acoustic wave device.

14. The acoustic wave device assembly of claim 12 further comprising a via extending through the first boundary acoustic wave device.

15. The acoustic wave device assembly of claim 12 further comprising a dielectric layer positioned between the first die and the second die.

16. The acoustic wave device assembly of claim 12 further comprising an air gap between the first die and the second die.

17. The acoustic wave device assembly of claim 12 further comprising a shielding layer positioned between the first die and the second die.

18. The acoustic wave device assembly of claim 12 wherein the first die and the second die are included within a packaged radio frequency module, and the packaged radio frequency module has a thickness of less than 300 micrometers.

19. The acoustic wave device assembly of claim 12 further comprising a third die stacked with the first die and the second die, the third die including a third boundary acoustic wave device, the first die and the second die and the third die being included within a packaged radio frequency module, and the packaged radio frequency module having a thickness of less than 300 micrometers.

20. The acoustic wave device assembly of claim 12 wherein the first boundary acoustic wave device is included in a first acoustic wave filter, and the second boundary acoustic wave device is included in a second acoustic wave filter.

* * * * *